United States Patent [19]

Mori et al.

[11] Patent Number: 4,700,071

[45] Date of Patent: Oct. 13, 1987

[54] METHOD OF RECORDING AND REPRODUCING AN ELECTRON MICROSCOPE IMAGE

[75] Inventors: Nobufumi Mori; Yuichi Hosoi; Kenji Takahashi; Junji Miyahara, all of Kanagawa, Japan

[73] Assignee: Fuji Photo Film Co., Ltd., Japan

[21] Appl. No.: 818,663

[22] Filed: Jan. 14, 1986

[30] Foreign Application Priority Data

Jan. 16, 1985 [JP] Japan .................................... 60-5159

[51] Int. Cl.$^4$ ........................ G01N 23/04; H01J 37/24
[52] U.S. Cl. .................................. 250/327.2; 250/311; 250/397
[58] Field of Search .................. 250/327.2, 337, 484.1, 250/397, 311

[56] References Cited

U.S. PATENT DOCUMENTS

| | | | |
|---|---|---|---|
| 3,859,527 | 1/1975 | Luckey | 250/327.2 |
| 4,206,349 | 6/1980 | Kamimura | 250/311 |
| 4,258,264 | 3/1981 | Kotera et al. | 250/484.1 |
| 4,276,473 | 6/1981 | Kato et al. | 250/327.2 |
| 4,315,318 | 2/1982 | Kato et al. | 364/515 |
| 4,380,702 | 4/1983 | Takahashi et al. | 250/327.2 |
| 4,387,428 | 6/1983 | Ishida et al. | 364/414 |
| 4,400,619 | 8/1983 | Kotera et al. | 250/327.2 |
| 4,527,061 | 7/1985 | Horikawa et al. | 250/327.2 |

FOREIGN PATENT DOCUMENTS

| | | | |
|---|---|---|---|
| 166922 | 1/1986 | European Pat. Off. | 250/327.2 |
| 0047720 | 4/1980 | Japan . | |
| 0047719 | 4/1980 | Japan . | |
| 0121874 | 7/1983 | Japan . | |

*Primary Examiner*—Janice A. Howell
*Assistant Examiner*—Constantine Hannaher
*Attorney, Agent, or Firm*—Gerald J. Ferguson, Jr.; Michael P. Hoffman; Ronni S. Malamud

[57] ABSTRACT

A two-dimensional image sensor such as a stimulable phosphor sheet is exposed under vacuum to an electron beam that has passed through a specimen to cause the two-dimensional image sensor to store the energy of the electron beam, then stimulating energy is applied to the two-dimensional image sensor for discharging light therefrom which represents the stored energy of the electron beam, and the light discharged from the two-dimensional image sensor is photoelectrically detected to produce an image signal. A reference image signal is also produced in a similar manner by exposing the two-dimensional image sensor to an electron beam that has not passed through the specimen. One of the first-mentioned image signal and the reference image signal is subtracted from the other per pixel to generate a difference signal, from which an electron microscope image of the specimen is reproduced.

11 Claims, 3 Drawing Figures

METHOD OF RECORDING AND REPRODUCING AN ELECTRON MICROSCOPE IMAGE

BACKGROUND OF THE INVENTION

1. the Invention

The resent invention relates to a method of recording and reproducing an electron microscope image, and more particularly to a method of recording electron microscope images with high sensitivity and of reproducing the recorded electron microscope images in the form of electric signals in order to allow the images to be processed in various ways.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a transmission image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified transmission image or the diffraction pattern may be produced selectively as desired by adjusting the focal length of the intermediate lens.

For observing the magnified image or the diffraction pattern (hereinafter referred to collectively as a "transmitted electron-beam image"), it has been the general practice to place a photographic film on the image formation plane of the projector lens for exposure to the transmitted electron-beam image. According to another design, an image intensifier is employed to amplify the transmitted electron-beam image for projection. The use of photographic films is however disadvantageous in that their sensitivity to electron beams is low and the process of developing the films is complex. The image intensifier also has drawbacks in that the images produced thereby have poor sharpness and are likely to become distorted.

Transmitted electron-beam images are often processed to make them easier to see. Specifically, the transmitted electron-beam images are subjected to various signal processing modes such as tone processing, frequency emphasis, density processing, subtractive processing, and additive processing. The images are also processed to reconstruct three-dimensional images by Fourier analysis, digitize the images, and measure particle diameters. The diffraction patterns are also processed to analyze crystal information and find lattice constants, dislocations, and lattice defects. For such image and diffraction pattern processing, it has been customary to convert the electron microscope image on a developed photographic film into an electric signal with a microphotometer, convert the electric signal into a digital signal, and then process the digital signal with a computer. This process has proven unsatisfactory since it is quite complex.

In view of the conventional drawbacks, the applicants have proposed a novel method of recording and reproducing electron microscope images with high sensitivity and image quality, the method being capable of directly generating electric signals representing the electron microscope images so as to permit these images to be processed in various ways (see Japanese Patent Application No. 59(1984)-214680 corresponding to U.S. Ser. No. 786,080). Basically, this method comprises the steps of storing the energy of an electron beam transmitted through a specimen on a two-dimensional image sensor kept in vacuum, applying light or heat to the two-dimensional image sensor to cause it to discharge the stored electron beam energy therefrom as light, photoelectrically detecting the discharged light to thereby produce an electric image signal, and reproducing the transmitted electron beam image of the specimen from the electric image signal.

The two-dimensional image sensor preferably comprises a stimulable phosphor sheet as disclosed in U.S. Pat. Nos. 4,258,264; 4,276,473; 4,315,318; 4,387,428, and Japanese Unexamined Patent Publication No. 56(1981)-11395, for example. Certain phosphors, when exposed to a radiation such as an electron beam, store a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor. The two-dimensional image sensor is generally composed of a support and a phosphor layer disposed on the support. The stimulable phosphor layer may be formed by dispersing the stimulable phosphor in a suitable binder. However, the stimulable phosphor layer may itself be a stimulable phosphor sheet if it is self-supporting. Examples of stimulable phosphors which the stimulable phosphor sheet can be made of are described in Japanese Patent Application No. 59(1984)-214680 referred to above.

The two-dimensional sensor may also be in the form of a thermoluminescent phosphor sheet as disclosed in Japanese Patent Publication Nos. 55(1980)-47719 and 55(1980)-47720, for example. The thermoluminescent phosphor sheet emits stored radiation energy as thermoluminescence when heat is applied to the sheet. The thermoluminescent phosphor sheet may be constructed in the same manner as the stimulable phosphor sheet.

The two-dimensional image sensor is placed on the image formation plane of the electron microscope, and the electron microscope image is recorded on the two-dimensional sensor by the electron beam transmitted through the specimen. Then, the two-dimensional sensor on which the electron microscope image is stored is scanned in X and Y directions, i.e., two-dimensionally, by stimulating rays such as visible light or heat to enable the image sensor to emit the stored electron beam energy as light. The emitted light is then photoelectrically read by a suitable photoelectric transducer which produces an electric signal indicative of the transmitted electron-beam image. The electric image signal thus generated may be employed to display the electron microscope image on a display unit such as a CRT, or to record the electron microscope image permanently as a hard copy, or to store the electron microscope image temporarily on a recording medium such as a magnetic tape, a magnetic disk, or the like.

The electron microscope images can be recorded with high sensitivity using the two-dimensional image sensor of the type described above. Damage to the specimen can be reduced since the amount of the electron beam to which the specimen is exposed can be reduced. The electric image signals produced from the two-dimensional image sensor can easily be processed in various modes, such as tone processing and frequency emphasis, for example. The processing of diffraction patterns, and image analyses such as the reconstruction of three-dimensional images and image digitization can simply and quickly be performed by applying the electric signal to a computer.

Where the aforesaid proposed method is employed to record and reproduce electron microscope images, however, the high recording sensitivity is oftentimes responsible for the generation of a spot-like image or the reproduction of an electron microscope image together with fog arising most probably from a scattered electron beam or a secondary X-ray.

SUMMARY OF THE INVENTION

It is an object of the present invention to provide a method of recording and reproducing an electron micrscope image without suffering the difficulties of the prior method.

According to the present invention, a two-dimensional image sensor is exposed under vacuum to an electron beam that has passed through a specimen to cause the two-dimensional image sensor to store the energy of the electron beam, then stimulating energy is applied to the two-dimensional image sensor for discharging light therefrom which represents the stored energy of the electron beam, and the light discharged from the two-dimensional image sensor is photoelectrically detected to produce an image signal. The two-dimensional image sensor is also exposed under vacuum to an electron beam that has not passed through the specimen to cause the two-dimensional image sensor to store the energy of the electron beam, thereafter stimulating energy is applied to the two-dimensional image sensor for discharging light therefrom which represents the stored energy of the electron beam, and the light discharged from the two-dimensional image sensor is photoelectrically detected to produce a reference image signal. An arithmetic operation is effected on the first-mentioned image signal and the reference image signal per pixel to generate a signal, and an electron microscope image of the specimen is reproduced from the last-mentioned signal.

In the event that the first-mentioned signal and the reference signal contain components representing a spot-like image or fog, such components can be canceled out by the arithmetic operation carried out on these signals, and the electron microscope image reproduced from the last-mentioned signal is free from such a spot-like image or fog. The "fog" herein referred to means mostly an image produced by the scattering electron beam or the secondary X-ray as mentioned hereinbefore.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
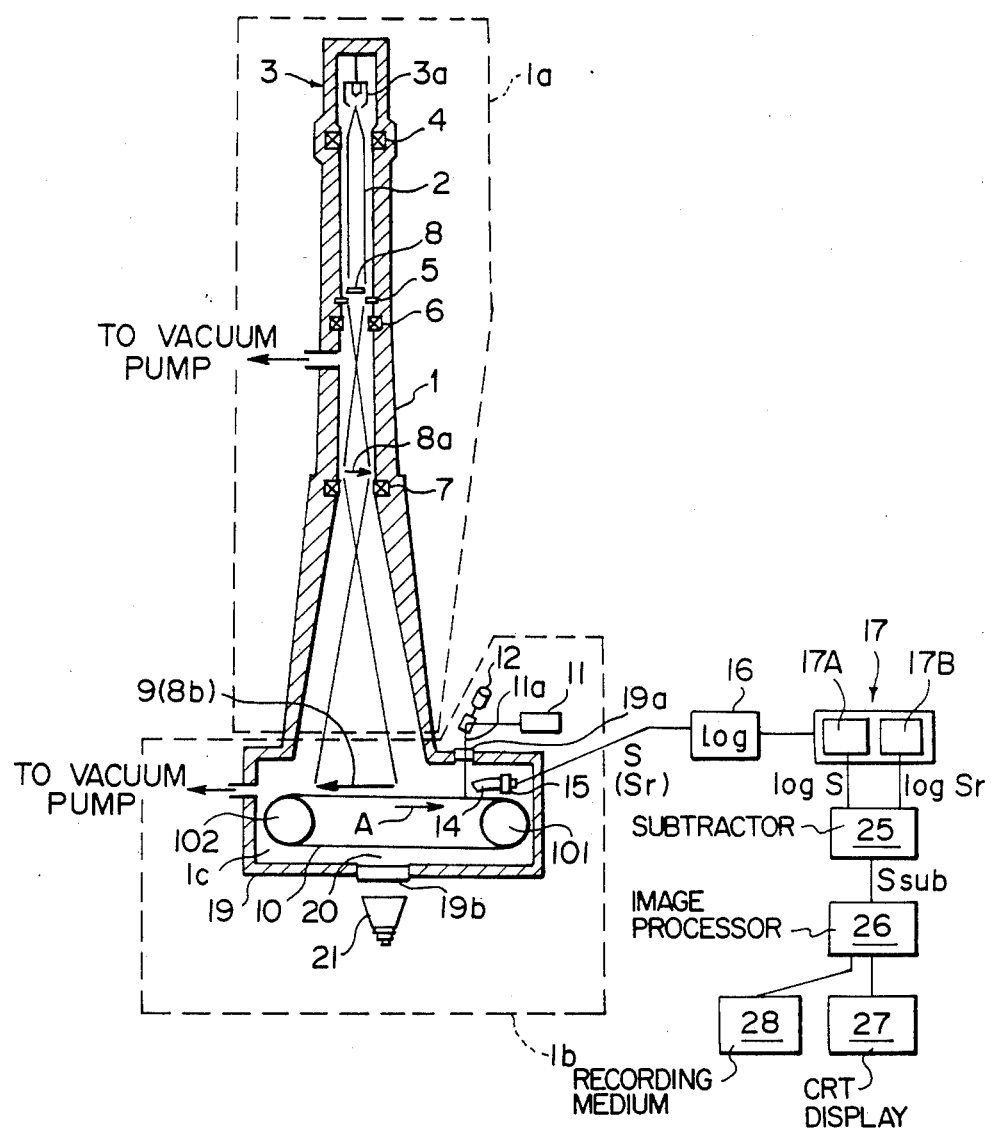
FIG. 1 is a vertical cross-sectional view of a device employed for carrying out a method according to a first embodiment of the present invention.

Like or corresponding parts are denoted by like or corresponding reference characters throughout the several views.

FIG. 1 shows a device for recording and reproducing electron microscope images, the device being employed to perform a method according to a first embodiment of the present invention. The device includes an electron microscope 1a having a tubular lens barrel 1 and a recorder/reader assembly 1b composed of a stimulable phosphor sheet 10 serving as a two-dimensional image sensor, a stimulating means for scanning the stimulable phosphor sheet 10 with stimulating light while the stimulable phosphor sheet 10 is placed under vacuum, and a detector means for photoelectrically detecting light emitted by the stimulable phosphor sheet 10. The stimulable phosphor sheet 10 and the image formation plane 9 of the electron microscope 1a are positioned in a vacuum chamber 1c at least when the stimulable phosphor sheet 10 is exposed to an electron beam for recording a specimen image thereon. The interior of the lens barrel 1 and the interior of the vacuum chamber 1c are kept under vacuum by a known means such as a vacuum pump while the electron microscope 1a is in operation.

The lens barrel 1 houses an electron gun 3 having a filament 3a for emitting an electron beam 2 at a uniform speed, at least one condenser lens 4 comprising a magnetic lens or an electrostatic lens for converging the electron beam 2 toward a specimen 8, a specimen support 5, an objective lens 6 identical to the condenser lens 4, and a projector lens 7. The electron beam 2 having passed through the specimen 8 placed on the specimen support 5 is deflected by the objective lens 6 to form a magnified transmission image 8a of the specimen 8. The magnified transmission image 8a is focused by the projector lens 7 as an image 8b on the image formation plane 9.

The stimulable phosphor sheet 10 in the recorder/reader 1b is in the form of an endless belt trained around a cylindrical driver roller 101 and a cylindrical driven roller 102 spaced horizontally from each other. The stimulating means has a stimulating light source 11 comprising an He - Ne laser or a semiconductor laser for emitting a stimulating light beam 11a and a light deflector 12 such as a galvanometer mirror for deflecting the stimulating light beam 11a transversely across the sheet 10 to scan the same. The vacuum chamber 1c is defined by a casing 19 communicating with the lens barrel 1 and having a light-transmissive wall member 19a made of lead glass or the like and through which the stimulating light beam 11a passes from the light deflector 12 toward the sheet 10. The detector means includes a light guide 14 for collecting light emitted from the sheet 10, and a photoelectric transducer 15 such as a photomultiplier coupled to the exit end of the light guide 14 for detecting the emitted light through a filter which removes the stimulating light and producing a corresponding electric signal. The stimulable phosphor sheet 10 is composed of a flexible endless-belt support and a stimulable phosphor layer deposited on the outer surface of the endless-belt support. The endless-belt stimulable phosphor sheet 10 is driven to run in the direction of the arrow A when the driver roller 101 is rotated by a drive unit such as a motor.

The endless-belt stimulable phosphor sheet 10, the driver roller 101, the driven roller 102, the light guide 14, and the photoelectric transducer 15 are disposed in the vacuum chamber 1c. However, the exit end of the light guide 14 may project out of the casing 19 so that the photoelectric transducer 15 may be disposed outside of the vacuum chamber 1c.

In operation, a shutter (not shown) positioned between the electron microscope 1a and the recorder/reader assembly 1b is opened to expose the portion of the stimulable phosphor sheet 10 located in the image formation plane 9 to an electron beam which bears the magnified transmission image 8b of the specimen 8 for thereby storing the electron beam energy on the sheet 10. Then, the driver roller 101 is rotated to move the exposed portion of the sheet 10 from the recording zone and also to move a following unexposed portion of the sheet 10 toward the recording zone. When recording the transmission image 8b on the sheet 10, it may be focused by the focusing methods disclosed by Japanese Patent Application Nos. 59(1984)-214680 and 59(1984)-214681.

The exposed portion of the sheet 10 is moved by the driver roller 101 into a read-out zone. In the read-out zone, the sheet 10 is scanned transversely (main scanning) by the stimulating light beam 11a deflected by the light deflector 12 and transmitted through the light-transmissive wall member 19a, while at the same time the sheet 10 is continuously moved in the direction of the arrow A so that the sheet 10 is scanned longitudinally (subscanning). Therefore, the stimulable phosphor sheet 10 is two-dimensionally scanned by the stimulating light beam 11a. Light which is emitted from the sheet 10 upon exposure to the stimulating light beam 11a and which is commensurate with the level of the stored electron beam energy, enters the light guide 14 through its light input end and travels therethrough while being subject to total reflection therein. The light is then detected by the photoelectric transducer 15 which photoelectrically converts the emitted amount of light into an electric image signal S.

The electric image signal S generated by the photoelectric transducer 15 is then converted by a logarithmic converter 16 including an amplifier and an A/D converter into a digital image signal logS of a logarithmic value. The digital image signal logS is stored in an image file 17A in a recording medium 17 such as a magnetic disk.

After the light emitted from the sheet 10 has been read out, the driver roller 101 is rotated to feed the image-recording portion of the sheet 10 into an erasing zone 20 where erasing light emitted from an erasing light source 21 such as a fluorescent lamp disposed outside of the casing 19 is radiated onto the sheet 10 through a light-transmissive wall member 19b supported on the casing 19. The erasing light is in the same wavelength region as that of the stimulating light for the stimulable phosphor sheet 10. Therefore, upon exposure to the erasing light from the erasing light source 21, any remanent image stored in the phosphor layer of the sheet 10 and noise arising from a radioactive element such as $^{226}$Ra contained as an impurity in the phosphor layer can be discharged from the sheet 10. The erasing light source 21 may comprise a tungsten lamp, a halogen lamp, an infrared lamp, a xenon flash lamp, or a laser source, as disclosed in U.S. Pat. No. 4,400,619.

The image-recording portion of the sheet 10 from which the remanent image and noise have been erased is thereafter delivered to the recording zone in which it is exposed to the electron beam 2 again. At this time, the specimen 8 has been removed from the specimen support 5, and hence the electron beam 2 emitted from the electron gun 3 impinges directly upon the sheet 10. The portion of the sheet 10 which stores the electron beam energy is moved again into the read-out zone in which the stimulating light beam 11a is applied to the sheet 10. Light emitted from the sheet 10 upon exposure to the stimulating light beam 11a is photoelectrically read by the photoelectric transducer 15, which now produces a reference image signal Sr. The reference image signal Sr is then converted by the logarithmic converter 16 into a logarithmic digital image signal logSr which is stored in an image file 17B in the recording medium 17. Where the sheet 10 is sufficiently long, a portion of the sheet 10 in which the electron beam energy can be stored is moved into the recording zone when the sheet 10 is fed a predetermined distance for reading the stored electron beam energy therefrom. Therefore, a next electron microscope image can be recorded on such a portion, and it is not necessary to move the sheet 10 in one complete cycle each time an electron microscope image is recorded thereon.

Reproduction of an electron microscope image from the digital image signals logS, logSr will be described below. The digital image signals logS, logSr are read from the image files 17A, 17B to a subtractor 25 which appropriately weights the digital image signals logS, logSr as required and subtracts one from the other per pixel to provide a digital difference signal Ssub.

When the magnified transmission image 8b is recorded on the stimulable phosphor sheet 10 with high sensitivity, a spot-like image or fog may sometimes be recorded on the sheet 10 as described above. The digital image signals logS, logSr accordingly contain components representing such a spot-like image and fog. Such components can however be canceled out by effecting the subtractive process between the digital image signals logS, logSr per each pixel. Consequently, the difference signal Ssub represents the magnified transmission image 8b only.

The difference signal Ssub is then processed by an image processor 26 as in a tone processing mode, a frequency processing mode, or the like, and the processed signal is fed to an image reproducer 27 such as a CRT display, for example.

Figure 2:
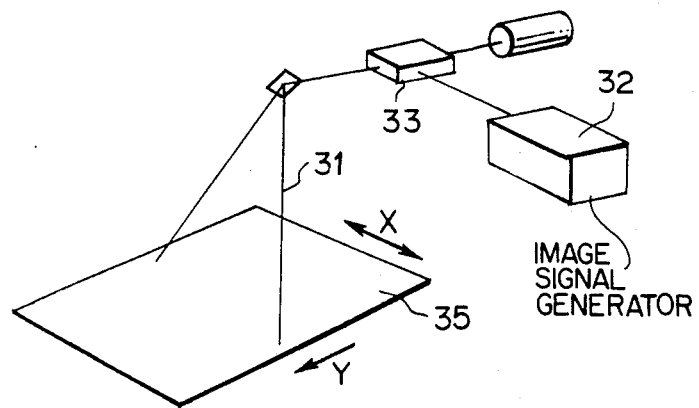
FIG. 2 is a perspective view of an image reproducer used in the method of the present invention.

The image reproducer 27 may alternatively comprise an image scanning recorder for recording an image optically on a photosensitive film, as shown in FIG. 2. The photosensitive film, denoted at 35, is scanned transversely in the direction of the arrow X (main scanning) by a recording laser beam 31 while at the same time the photosensitive film 35 is moved in the direction of the arrow Y (subscanning). At this time, the laser beam 31 is modulated by an acoustooptic modulator 33 based on an image signal supplied from an image signal generator 32 for thereby forming a visible image on the photosensitive film 35. By using the signal from the image processor 26 (FIG. 2) as the image signal applied to the acoustooptic modulator 33, the magnified transmission image 8b stored on the sheet 10 can be reproduced on the photosensitive film 35. Since the difference signal Ssub does not contain any components indicative of the spot-like image and fog, the image reproduced on the photosensitive film 35 based on the difference signal Ssub is free from the spot-like image and fog and properly represents the magnified transmission image 8b of the specimen 8.

The size of the final output image which is reproduced on the CRT display 27 or the photosensitive film 35 is preferably selected to be larger than the size of the image formation plane 9 (i.e., the area in which the radiation image energy is recorded on the sheet 10). Therefore, the magnified transmission image 8b is reproduced at a scale greater than that on the image formation plane 9.

For producing a magnified image from the image scanning recorder shown in FIG. 2, the density of scanning lines employed in the image scanning recorder should be coarser than the density of scanning lines used in reading image information from the stimulable phosphor sheet 10. More specifically, it is preferable to set the scanning line density to 10 pixels/mm or more, particularly to between 15 pixels/mm and 100 pixels/mm, for reading sufficiently image information from the stimulable phosphor sheet 10 of a relatively small size. For recording a reproduced magnified image without degrading its quality, the scanning line density for recording the image is selected to be coarser than the above scanning line density and preferably in the range from 5 pixels/mm to 20 pixels/mm.

The image signal from the image processor 26 may be fed directly to the image reproducer 27, as described above, for immediate reproduction of the electron microscope image, or may be stored in a recording medium 28 such as a magnetic tape, a magnetic disk, or the like for subsequent image reproduction.

A suitable light shutter may be disposed between the recording zone and the read-out zone in the recorder/reader assembly 1b for allowing simultaneous reading of the magnified transmission image 8b from the sheet 10 and storing, on the sheet 10, of the energy of the electron beam 2 which has not passed through the specimen 8. Rather than the endless-belt stimulable phosphor sheet 10, a single stimulable phosphor sheet may be employed which is reciprocally moved between the recording and read-out zones for alternately recording and reading images. One or more such stimulable phosphor sheets may be fixed to a feed means such as an endless belt which is driven to use the stimulable phosphor sheet or sheets in repetitive cycles. In such alternative arrangements, a plurality of differently focused images may be recorded at different areas on the single stimulable phosphor sheet. The electron beam 2 which has not passed through the specimen 8 may first be recorded on the sheet 10 prior to recording of the magnified transmission image 8b.

The coefficients used for weighting the digital image signals logS, logSr and the bias for keeping the density of the reproduced image substantially constant are determined by various conditions such as the voltage of the electron gun 3 for accelerating the electron beam, the current density of the electron gun 3, and the time for applying the electron beam 2 to the specimen 8. Combinations of such conditions, weighting coefficients, and biases are stored as a look-up table in a memory means. In operation, an optimum combination of weighting coefficients and a bias is determined from the look-up table based on signals indicative of the above conditions and detected from the electron microscope. With this arrangement, since it is not necessary to manually establish the weighting coefficients and bias in the subtractor 25, the difference signal can automatically be generated by the subtractor 25.

A shutter may be disposed in the lens barrel 1 between the specimen 8 and the electron gun 3 for cutting off the electron beam 2 when the sheet 10 is not exposed to the electron beam 2, so that the specimen 8 will be less subject to damage due to bombardment by the electron beam 2.

Figure 3:
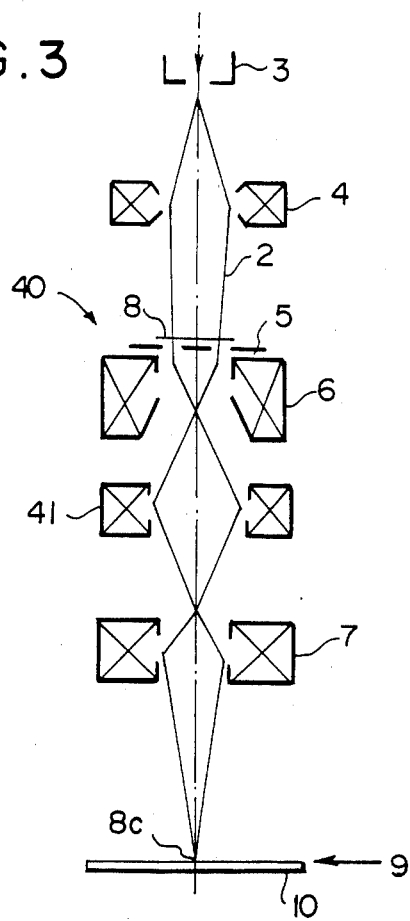
FIG. 3 is a schematic view of an electron microscope employed for effecting a method according to a second embodiment of the present invention.

The principles of the present invention can be employed for recording and reproducing the diffraction pattern of a specimen. FIG. 3 is an explanatory view of another electron microscope used for recording and reproducing such a diffraction pattern 8c of the specimen 8. The electron microscope, generally denoted at 40, has an intermediate lens 41 disposed between the objective lens 6 and the projector lens 7. The diffraction pattern 8c of the specimen 8, which is formed on the rear focal plane of the objective lens 6, is magnified by the intermediate lens 41 and the projector lens 7 with their focal points on the rear focal plane of the objective lens 6 and is projected onto the image formation plane 9. By placing the stimulable phosphor sheet 10 in the image formation plane 9, the magnified image of the diffraction pattern 8c can be recorded by the electron beam 2 on the stimulable phosphor sheet 10. The recorded diffraction pattern 8c can be read in the same manner as described with reference to FIG. 1, and the read image can be displayed on the CRT or printed as a hard copy.

The recorded pattern or recorded information is determined by the recorded condition of a transmitted electron-beam image (magnified transmission image or magnified diffraction pattern) recorded on the stimulable phosphor sheet 10, the nature of the specimen 8, and the manner of recording the image. For eliminating any adverse effect arising from varied recording conditions or for obtaining an electron microscope image which can clearly be observed, such recorded information should be obtained prior to the reproduction of a visible image by which the specimen can be observed. The read-out gain of the photomultiplier 15 should be adjusted or the image-dependent signal should be processed by the image processor 26 on the basis of the obtained recorded information. Furthermore, the generation of a reproduced image which can effectively be observed requires that a recording scale factor be determined in order to optimize the resolution of the reproduced image dependent on the contrast of the recorded pattern.

One way of obtaining the recorded information on the stimulable phosphor sheet 10 before a visible image is produced for observing the specimen 8 is disclosed in Japanese Unexamined Patent Publication No. 58(1983)-89245. More specifically, prior to the generation of a visible image for observing the specimen 8 (main reading mode), the recorded information stored in the stimulable phosphor sheet 11 is read (preliminary reading mode) with stimulating light having a lower level of energy than that of stimulating light to be applied in the main reading mode. Based on the recorded information thus obtained, the read-out gain is suitably adjusted or a recording scale factor is determined for the main reading mode, or the signal generated in the main reading mode is appropriately processed.

The photoelectric transducer 15 for photoelectrically reading light emitted from the stimulable phosphor sheet 10 may comprise a solid-state photoelectric transducer rather than the photomultiplier (see Japanese Patent Application Nos. 58(1983)-86226, 58(1983)-86227, 58(1983)-219313, and 58(1983)-219314, and Japanese Unexamined Patent Publication No. 58(1983)-121874). A plurality of solid-state photoelectric transducer elements may be disposed in covering relation to the entire surface of the stimulable phosphor sheet 10, or may be integral with the sheet 10, or may be located closely to the sheet 10. The photoelectric transducer 15 may also employ a line sensor composed of an array of solid-state photoelectric transducer elements, or a single solid-state photoelectric transducer element corresponding to one pixel and movable to scan the entire surface of the sheet 10.

The source 11 of stimulating light may employ an array of light-emitting diodes or semiconductor lasers for preventing loss of light emitted from the sheet 10 and for allowing the photoelectric transducer 15 to detect emitted light at a larger angle for an increased S/N ratio. The electric signal generated by the photoelectric transducer 15 can be read out at a high speed since the signal is rendered time-dependent by electric processing in the photoelectric transducer 15, not by time-dependent application of the stimulating light.

The stimulable phosphor sheet may be a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Publication No. 55(1980)-47720.

After the image has been recorded on the stimulable phosphor sheet 10, the vacuum chamber 1c may be devacuumized, then the sheet 10 may be taken out of the vacuum chamber 1c, and finally the image stored therein may be read by an image reader separate from the electron microscope. However, where the stimulable phosphor sheet is recyclically used in the vacuum chamber 1c as illustrated, it would not be required to replace photographic films by breaking the vacuum condition in the vacuum chamber 1c as with the conventional process employing such photographic films, and therefore a number of images can successively be picked up.

In the above-described embodiments, the reference image signal obtained by exposing the two-dimensional image sensor to an electron beam that has not passed through the specimen is obtained each time the electron microscope image is recorded and reproduced. However, it would be noted that the reference image signal obtained initially may be memorized in the apparatus and read out for repeated use for canceling out the spot-like image or fog.

Although certain preferred embodiments have been shown and described, it should be understood that many changes and modifications may be made therein without departing from the scope of the appended claims.

We claim:

1. A method of recording and reproducing an image produced by an electron microscope, comprising the steps of:
   (i) exposing a two-dimensional image sensor under vacuum to an electron beam that has passed through a specimen to cause said two-dimensional image sensor to store the energy of said electron beam;
   (ii) then, applying stimulating energy to said two-dimensional image sensor for discharging light therefrom which represents the stored energy of the electron beam;
   (iii) photoelectrically detecting the light discharged from said two-dimensional image sensor to produce an image signal;
   (iv) exposing said two-dimensional image sensor under vacuum to an electron beam that has not passed through said specimen to cause said two-dimensional image sensor to store the energy of said electron beam;
   (v) thereafter, applying stimulating energy to said two-dimensional image sensor for discharging light therefrom which represents the stored energy of the electron beam;
   (vi) photoelectrically detecting the light discharged from said two-dimensional image sensor to produce a reference image signal;
   (vii) effecting an arithmetic operation on said first-mentioned image signal and said reference image signal per pixel to generate a signal; and
   (viii) reproducing an electron microscope image of said specimen from said last-mentioned signal.

2. A method according to claim 1, wherein the light discharged from said two-dimensional image sensor is photoelectrically detected while said two-dimensional image sensor is placed under vacuum.

3. A method according to claim 1, wherein said two-dimensional sensor comprises a stimulable phosphor sheet for discharging stimulated emission as said light respresenting the stored energy of the electron beam in response to exposure to said stimulating energy.

4. A method according to claim 1, wherein said stimulating energy is light.

5. A method according to claim 1, wherein said stimulating energy is heat.

6. A method according to claim 1, wherein said arithmetic operation is effecting by subtracting one of said first-mentioned image signal and said reference image signal from the other to produce a difference signal as said last-mentioned signal.

7. A method according to claim 6, wherein said first-mentioned image signal and said reference image signal are converted respectively into logarithmic digital image signals before said arithmetic operation is effected.

8. A method according to claim 6, wherein said first-mentioned image signal and said reference image signal are stored before said arithmetic operation is effected thereon.

9. A method according to claim 6, wherein said first-mentioned image signal and said reference image signal are weighted before said arithmetic operation is effected thereon.

10. A method according to claim 1 wherein said steps of exposing the two-dimensional image sensor to an electron beam that has not passed through the specimen, thereafter applying stimulating energy to said sensor and detecting the light discharged therefrom to produce a reference image signal are conducted only once for a plurality of steps of recording and reproducing images.

11. A method according to claim 10 wherein said reference image signal obtained is memorized and repeatedly read out for said arithmetic operation each time the image is recorded and reproduced.

* * * * *